United States Patent
Xiang

(10) Patent No.: US 9,281,063 B2
(45) Date of Patent: Mar. 8, 2016

(54) METHOD FOR PROCESSING DATA, FLASH MEMORY, AND TERMINAL

(71) Applicant: Huawei Technologies Co., Ltd., Shenzhen, Guangdong (CN)

(72) Inventor: Guangheng Xiang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/329,460

(22) Filed: Jul. 11, 2014

(65) Prior Publication Data

US 2014/0321210 A1    Oct. 30, 2014

Related U.S. Application Data

(63) Continuation of application No. PCT/CN2012/076108, filed on May 25, 2012.

(51) Int. Cl.
*G11C 16/06* (2006.01)
*G11C 16/04* (2006.01)
*G11C 16/16* (2006.01)

(52) U.S. Cl.
CPC ............ *G11C 16/0483* (2013.01); *G11C 16/04* (2013.01); *G11C 16/0408* (2013.01); *G11C 16/0416* (2013.01); *G11C 16/16* (2013.01); *G11C 16/06* (2013.01)

(58) Field of Classification Search
CPC .. G11C 16/10; G11C 16/0483; G11C 16/102; G11C 16/30; G11C 2029/5004; G11C 11/5628; G11C 13/0069; G11C 16/0433

USPC ............ 365/189.09, 185.08, 185.26, 185.16, 365/185.27, 189.08, 191, 230.03
See application file for complete search history.

(56) References Cited

U.S. PATENT DOCUMENTS

| | | | |
|---|---|---|---|
| 5,255,237 A | 10/1993 | Kodama | |
| 6,418,060 B1 | 7/2002 | Yang et al. | |
| 2004/0080355 A1* | 4/2004 | Chen | 327/376 |
| 2007/0258291 A1 | 11/2007 | Lue et al. | |
| 2010/0238733 A1 | 9/2010 | Fukuda et al. | |
| 2011/0170356 A1 | 7/2011 | Kang et al. | |
| 2012/0113726 A1 | 5/2012 | Huang et al. | |
| 2013/0021850 A1 | 1/2013 | Yuan | |

FOREIGN PATENT DOCUMENTS

| | | |
|---|---|---|
| CN | 102339644 A | 2/2012 |
| CN | 102456745 A | 5/2012 |

* cited by examiner

*Primary Examiner* — Thong Q Le

(57) ABSTRACT

Embodiments of the present invention provide a flash memory which has high operating efficiency and a longer service life, and relate to the field of electronic technologies. The flash memory includes a control circuit and a plurality of memory cells, where the memory cell is a floating-gate MOS transistor which includes a source, a gate, a drain, and a substrate; the control circuit is separately connected to the source, the gate, the drain, and the substrate and configured to output a control signal to them, so as to implement a bitwise overwrite operation on the memory cell; and the control circuit is further configured to generate a control signal when data stored by any one of the memory cells is 0, so that the memory cell overwrites the data stored by the memory cell from 0 to 1 according to the control signal.

10 Claims, 5 Drawing Sheets

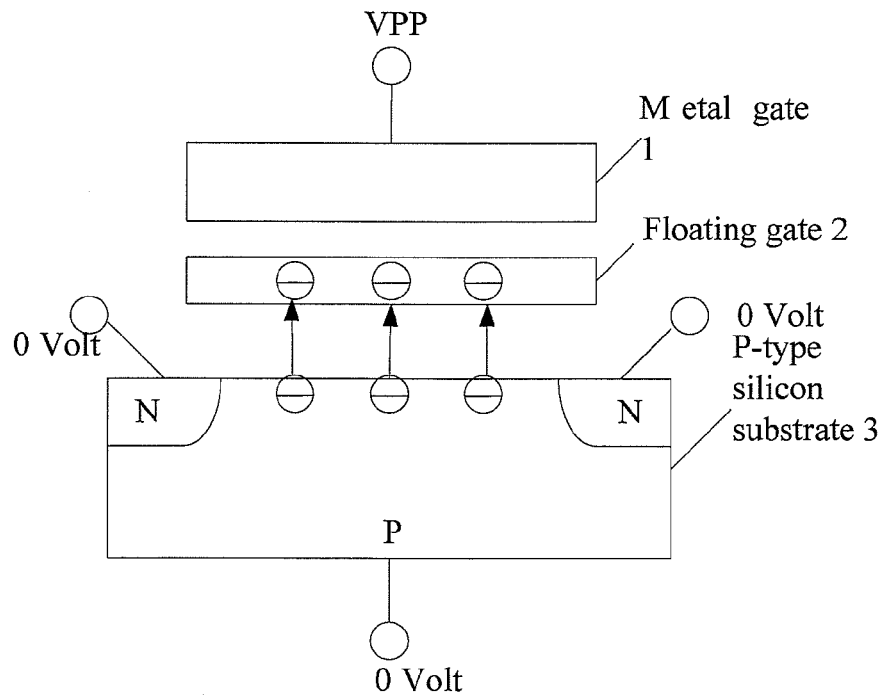

FIG. 5

| When data stored by any one of the memory cells is 0, generate a control signal, where the control signal includes that a substrate of the memory cell is grounded, a source is connected to a negative voltage programming power VPP, a drain is connected to the negative VPP, and a gate is connected to the negative VPP | S401 |
|---|---|
| Overwrite the data stored by the memory cell from 0 to 1 according to the control signal | S402 |

FIG. 6

METHOD FOR PROCESSING DATA, FLASH MEMORY, AND TERMINAL

CROSS-REFERENCE TO RELATED APPLICATION

This application is a continuation of International Application No. PCT/CN2012/076108, filed on May 25, 2012, which is hereby incorporated by reference in its entirety.

TECHNICAL FIELD

The present invention relates to the field of electronic technologies, and in particular, to a method for processing data, a flash memory, and a terminal.

BACKGROUND

A Flash (flash memory) is a non-volatile memory that is made by using a semiconductor floating-gate technology. It can retain stored data information even in a case of a power outage. The Flash indicates a state of stored data by using a floating gate that is either charged or not, that is, indicates stored data 0 by charging a floating gate, which is referred to as programming, and indicates stored data 1 by removing an electric charge from the floating gate, which is referred to as erasing. Regarding the Flash, any data bit must be completely erased before being used for storage. However, due to a technical limitation, erasing in the Flash must be performed on a block basis.

One block in a Flash has several pages. As shown in FIG. 1, if data on a page 1 and a page 2 in a block A needs to be updated into data to be written, a new block B is found and the data to be written is written into a page 1 and a page 2 of the block B; data, which does not need to be updated, on remaining 62 pages in the block A is read and written into a corresponding position in the block B; and then the block A is entirely erased for storing data later.

During implementation of the present invention, the inventor finds that the prior art has at least the following problems: In a process of storing the data to be written, the data that does not need to be updated in the block A is read and written into the block B, which increases the times of read operations and write operations, thereby reducing the operating efficiency and shortening a service life of the Flash.

SUMMARY

In order to improve the operating efficiency and extending a service life of a Flash, embodiments of the present invention provide a method for processing data, a flash memory, and a terminal to resolve a problem in the prior art where a Flash has a short service life.

Specifically, an embodiment of the present invention provides a flash memory, including a control circuit and a plurality of memory cells, where the memory cell is a floating-gate metal-oxide-semiconductor (MOS) transistor, and the floating-gate MOS transistor includes a source, a gate, a drain, and a substrate; the control circuit is separately connected to the source, the gate, the drain, and the substrate and configured to output a control signal to the source, the gate, the drain, and the substrate, so as to implement a bitwise overwrite operation on the memory cell; and the control circuit is further configured to generate a control signal when data stored by any one of the memory cells is 0, so that the memory cell overwrites the data stored by the memory cell from 0 to 1 according to the control signal, where the control signal includes that the substrate of the memory cell is grounded, the source is connected to a negative voltage programming power (VPP), the drain is connected to the negative VPP, and the gate is connected to the negative VPP.

An embodiment of the present invention further provides a flash memory, including a control circuit and a plurality of memory cells, where the memory cell is a floating-gate MOS transistor, and the floating-gate MOS transistor includes a source, a gate, a drain, and a substrate;

the control circuit is configured to output a plurality of control signals to separately connect to the source, the gate, the drain, and the substrate, so as to implement a bitwise overwrite operation on the memory cell; and the control circuit is further configured to read original data of a region to be updated in the memory cell, determine, on a bitwise basis, whether the original data is consistent with data to be written, and if inconsistent, generate a first control signal when data corresponding to a current bit of the original data is 0, so that the memory cell corresponding to the current bit overwrites data stored by the memory cell from 0 to 1, where the first control signal includes that the substrate of the memory cell is grounded, the source is connected to a negative VPP, the drain is connected to the negative VPP, and the gate is connected to the negative VPP.

An embodiment of the present invention further provides a method for processing data by using a foregoing flash memory, including:

when data stored by any one of the memory cells is 0, generating a control signal, where the control signal includes that a substrate of the memory cell is grounded, a source is connected to a negative VPP, a drain is connected to the negative VPP, and a gate is connected to the negative VPP; and overwriting the data stored by the memory cell from 0 to 1 according to the control signal.

An embodiment of the present invention further provides a method for processing data by using a foregoing flash memory, including:

reading original data of a region to be updated in the memory cell; and determining, on a bitwise basis, whether the original data is consistent with data to be written; and if inconsistent, when data corresponding to a current bit of the original data is 0, generating a first control signal, and overwriting the data that is stored by the memory cell and corresponds to the current bit from 0 to 1 according to the first control signal, where the first control signal includes that a substrate of the memory cell is grounded, a source is connected to a negative voltage programming power VPP, a drain is connected to the negative VPP, and a gate is connected to the negative VPP.

An embodiment of the present invention further provides a terminal which includes a foregoing flash memory.

The technical solutions provided by the embodiments of the present invention produce the following benefits: When original data in a memory cell of a flash memory needs to be updated, a control circuit of the flash memory may overwrite 0 into 1 on a bitwise basis according to a corresponding control signal, thereby implementing bitwise erasing on the data and implementing data updating. In other words, in a process of data updating, a corresponding overwrite operation is directly performed only on a bit to be updated, and it is unnecessary to search for a new block to write all data to be written or to perform an erase operation on a block to store data, which correspondingly reduces the times of additional read operations and write operations, thereby improving the operating efficiency and extending a service life of the flash memory.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 5 is a schematic diagram of a floating-gate MOS transistor where 1 is overwritten into 0 according to Embodiment 3 of the present invention;

FIG. 6 is a flowchart of a method embodiment for processing data according to Embodiment 4 of the present invention;

DETAILED DESCRIPTION

To make the objectives, technical solutions, and advantages of the present invention more comprehensible, the following further describes the embodiments of the present invention in detail with reference to the accompanying drawings.

Embodiment 1

Figure 2:
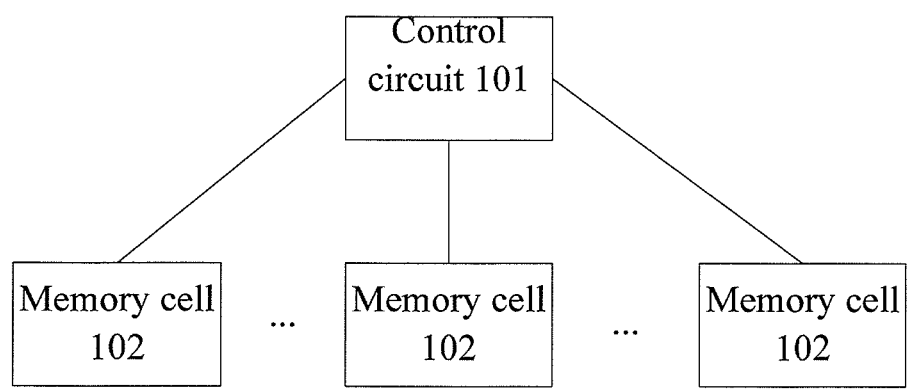
FIG. 2 is a schematic structural diagram of a flash memory embodiment according to Embodiment 1 of the present invention.

Refer to FIG. 2. FIG. 2 is a schematic structural diagram of a flash memory embodiment according to Embodiment 1 of the present invention. The flash memory includes a control circuit 101 and a plurality of memory cells 102.

The memory cell 102 is a floating-gate Metal-Oxide-Semiconductor (MOS) transistor, where the floating-gate MOS transistor includes a source, a gate, a drain, and a substrate. The control circuit 101 is separately connected to the source, the gate, the drain, and the substrate and configured to output a control signal to the source, the gate, the drain, and the substrate, so as to implement a bitwise overwrite operation on the memory cell 102.

The control circuit 101 is further configured to generate a control signal when data stored by any one of the memory cells 102 is 0, so that the memory cell 102 overwrites the data stored by the memory cell 102 from 0 to 1 according to the control signal, where the control signal includes that the substrate of the memory cell 102 is grounded, the source is connected to a negative voltage of programming power (VPP), the drain is connected to the negative VPP, and the gate is connected to the negative VPP.

In this embodiment, the overwriting, by the memory cell, the data stored by the memory cell from 0 to 1 according to the control signal may be considered as bitwise erasing.

Specifically, if the data stored by any one of the memory cells 102 is 0, the control circuit 101 generates the control signal, where the control signal includes that the substrate of the memory cell 102 is grounded, the source is connected to the negative VPP, the drain is connected to the negative VPP, and the gate is connected to the negative VPP. Correspondingly, a memory cell 102 corresponding to a current bit receives the control signal, and implements, according to a voltage connection condition of the substrate, the source, the drain, and the gate of the memory cell 102 in the control signal, that the substrate is grounded, the source is connected to the negative VPP (that is, −VPP), the drain is connected to the negative VPP, and the gate is connected to the negative VPP in the floating-gate MOS transistor. After the floating-gate MOS transistor is connected in this manner, channel field strength distribution formed thereby enables an electric charge on a floating gate to be moved to a channel, hence the electric charge on the floating gate is completely removed, thereby implementing a process of overwriting the data stored by the memory cell 102 from 0 to 1. That is, a process of bitwise erasing is implemented.

In this embodiment, when data stored by any one of memory cells is 0, a control circuit generates a control signal, so that the memory cell overwrites data stored by the memory cell from 0 to 1 according to the control signal, thereby implementing bitwise erasing on the data and implementing data updating. In other words, in a process of data updating, a corresponding overwrite operation is directly performed only on a bit to be updated, and it is unnecessary to search for a new block to write all data to be written or to perform an erase operation on a block to store data, which correspondingly reduces the times of additional read operations and write operations, thereby improving the operating efficiency and extending a service life of a flash memory.

Embodiment 2

Referring to FIG. 2, the flash memory includes a control circuit 101 and a plurality of memory cells 102.

The memory cell 102 is a floating-gate MOS (Metal-Oxide-Semiconductor, metal-oxide-semiconductor) transistor, where the floating-gate MOS transistor includes a source, a gate, a drain, and a substrate. The control circuit 101 is separately connected to the source, the gate, the drain, and the substrate and configured to output a control signal to the source, the gate, the drain, and the substrate, so as to implement a bitwise overwrite operation on the memory cell 102.

The control circuit 101 is further configured to read original data of a region to be updated in the memory cell 102, determine, on a bitwise basis, whether the original data is consistent with data to be written, and if inconsistent, generate a first control signal when data corresponding to a current bit of the original data is 0, so that the memory cell 102 corresponding to the current bit overwrites data stored by the memory cell from 0 to 1, where the first control signal includes that the substrate of the memory cell 102 is grounded, the source is connected to a negative VPP, the drain is connected to the negative VPP, and the gate is connected to the negative VPP.

In this embodiment, when original data in a memory cell of a flash memory needs to be updated, a control circuit of the flash memory reads original data of a region to be updated; determines, on a bitwise basis, whether the original data is consistent with data to be written; and if inconsistent, generates a first control signal when data corresponding to a current bit of the original data is 0, so that the memory cell corresponding to the current bit overwrites data stored by the memory cell from 0 to 1, thereby implementing bitwise erasing on the data and implementing data updating. In other words, in a process of data updating, a corresponding overwrite operation is directly performed only on a bit to be updated, and it is unnecessary to search for a new block to write all data to be written or to perform an erase operation on a block to store data, which correspondingly reduces the times of additional read operations and write operations, thereby improving the operating efficiency and extending a service life of a flash memory.

Embodiment 3

In the prior art, memory cells, that is, floating-gate MOS transistors, of a flash memory are divided on a block basis. If data at a bit needs to be erased, erasing is generally performed on a block basis. Moreover, a substrate of each floating-gate MOS transistor is connected to each other. When data is erased, that is, data stored in a floating-gate MOS transistor is changed from 0 to 1, a voltage of each substrates is connected to a positive VPP. The reason is that if programming is required, that is, the data stored in the floating-gate MOS transistor needs to be changed from 1 to 0, a voltage of a substrate needs to be grounded; therefore, if the voltage of each substrate is connected to the positive VPP, a gate, a source, and a drain of each floating-gate MOS transistor on the entire block can only be connected to a corresponding voltage to implement erasing on the entire block, which fails to implement corresponding bitwise programming. However, in this embodiment, when changing the data stored in the floating-gate MOS transistor from 1 to 0 and changing the data stored in the floating-gate MOS transistor from 0 to 1, the substrate of each floating-gate MOS transistor is grounded, and then a voltage connected to the gate, the source, and the drain of each floating-gate MOS transistor may be changed to implement corresponding bitwise programming and bitwise erasing operations.

Referring to FIG. 2, the Flash includes a control circuit 101 and a plurality of memory cells 102.

The memory cell 102 is a floating-gate MOS transistor, and the floating-gate MOS transistor includes a source, a gate, a drain, and a substrate. The control circuit 101 is configured to output a plurality of control signals to separately connect to the source, the gate, the drain, and the substrate, so as to implement a bitwise overwrite operation on the memory cell 102.

The control circuit 101 is further configured to read original data of a region to be updated in the memory cell 102 in the Flash, determine, on a bitwise basis, whether the original data is consistent with data to be written, and if inconsistent, generate a first control signal when data corresponding to a current bit of the original data is 0, so that the memory cell 102 corresponding to the current bit overwrites data stored by the memory cell from 0 to 1, where the first control signal includes that the substrate of the memory cell 102 is grounded, the source is connected to a negative VPP, the drain is connected to the negative VPP, and the gate is connected to the negative VPP.

Specifically, the Flash includes several blocks, each block includes several pages, and each page includes several bytes. A width of a byte may be changed according to specific requirements, and generally is 8 bits, 16 bits, 32 bits, or the like.

The Flash may specifically address each byte when performing addressing. When data of an addressable byte in the Flash needs to be updated, the control circuit 101 of the Flash may read the original data of the region to be updated, where the original data may be stored in a binary form. For example, the original data is 10101001 (where one byte has eight bits). The control circuit 101 may read the original data on a bitwise (bit) basis.

After reading the original data, the control circuit 101 determines, on a bitwise basis, whether the original data is consistent with data to be written. In an example where data to be written is 00111001, the control circuit 101 determines, on a bitwise basis, whether the original data 10101001 is consistent with the data 00111001 to be written; if consistent, such as bits 0, 1, 2, 3, 5, and 6 (a binary number is similar to a decimal number, where a bit on the right is the least significant bit, which is generally referred to as bit 0), performs no operation on data corresponding to a current bit of the original data; and if inconsistent, such as bits 4 and 7, generates a control signal according to data corresponding to the current bit of the original data, and sends the control signal to a memory cell 102 corresponding to the current bit, where the control signal includes a voltage connection condition of a substrate, a source, a drain, and a gate of the memory cell corresponding to the current bit.

Figure 3:
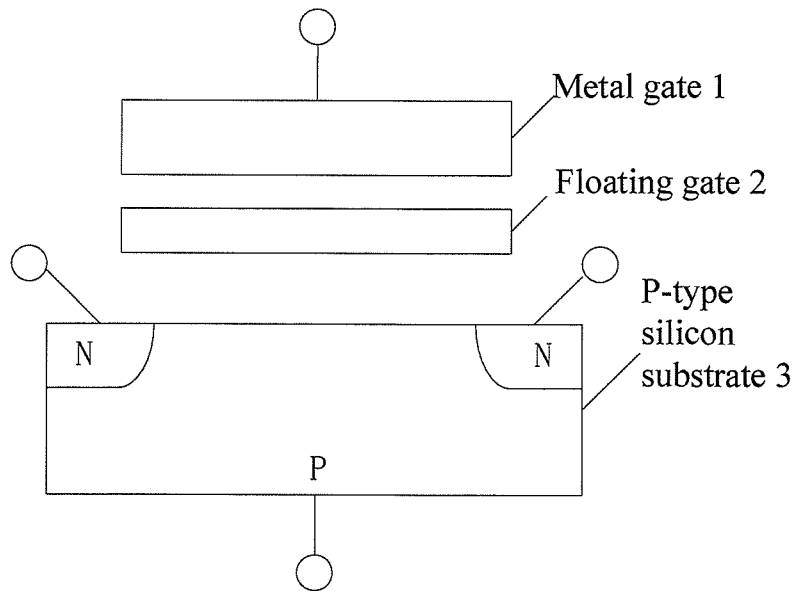
FIG. 3 is a schematic structural diagram of a floating-gate MOS transistor according to Embodiment 3 of the present invention.

Each bit of data corresponds to one memory cell 102. For example, one byte has eight bits, hence one byte corresponds to eight memory cells 102. The memory cell 102 may specifically be a floating-gate MOS transistor. A structure of the floating-gate MOS transistor is shown in FIG. 3, where FIG. 3 is a schematic structural diagram of a floating-gate MOS transistor according to Embodiment 3 of the present invention. It can be seen from FIG. 3 that, the floating-gate MOS transistor is an N-channel floating-gate MOS transistor, where a floating gate 2 is located between a metal gate 1 and a P-type silicon substrate 3. A source, a drain, and a gate of the floating-gate MOS transistor are shown in FIG. 3.

In this embodiment, an operation of overwriting data corresponding to a current bit of the original data is performed on a bitwise basis, where bitwise overwriting includes bitwise programming and bitwise erasing. Specifically, overwriting data corresponding to a current bit of the original data from 0 to 1 may be considered as bitwise erasing, and overwriting data corresponding to a current bit of the original data from 1 to 0 may be considered as bitwise programming.

Figure 4:
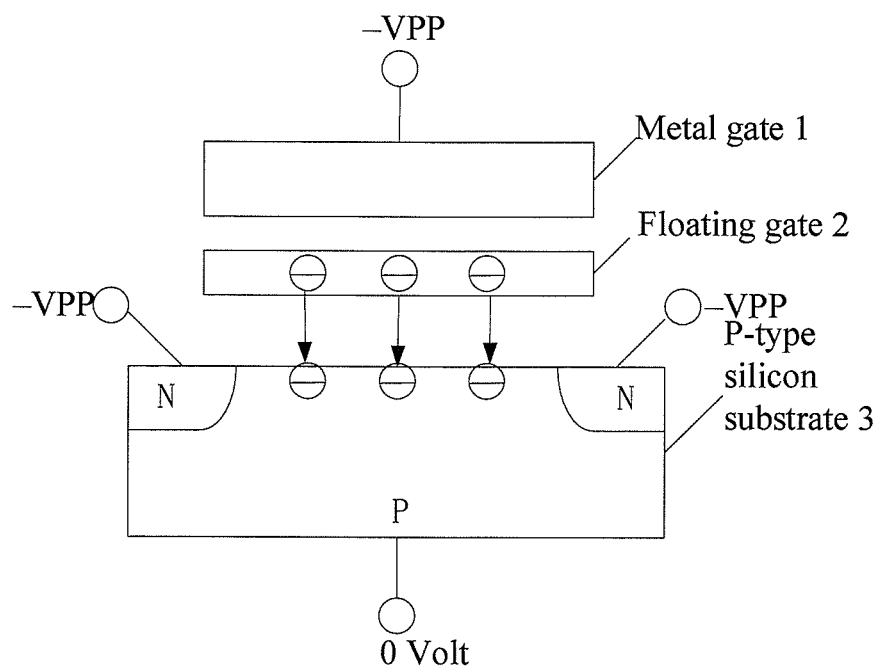
FIG. 4 is a schematic diagram of a floating-gate MOS transistor where 0 is overwritten into 1 according to Embodiment 3 of the present invention.

Specifically, if the data corresponding to the current bit of the original data is inconsistent with data corresponding to a current bit of the data to be written, a first control signal is generated when the data corresponding to the current bit of the original data is 0, where the first control signal includes that the substrate of the memory cell 102 is grounded, the source is connected to the negative VPP, the drain is connected to the negative VPP, and the gate is connected to the negative VPP. Correspondingly, the memory cell 102 corresponding to the current bit receives the first control signal, and implements, according to a voltage connection condition of the substrate, the source, the drain, and the gate of the memory cell in the first control signal, that the substrate is grounded, the source is connected to the negative VPP (that is, −VPP), the drain is connected to the negative VPP, and the gate is connected to the negative VPP in the floating-gate MOS transistor, as shown in FIG. 4, where FIG. 4 is a schematic diagram of a floating-gate MOS transistor where 0 is overwritten into 1 according to Embodiment 3 of the present invention. After the floating-gate MOS transistor is connected in this manner, channel field strength distribution formed thereby enables an electric charge on a floating gate to be moved to a channel, hence the electric charge on the floating gate is completely removed, thereby implementing a process of overwriting the data, which is stored by the memory cell and corresponds to the current bit, from 0 to 1. That is, a process of bitwise erasing is implemented.

In another implementation manner, the control circuit 101 is further configured to generate a second control signal if data corresponding to a current bit of the original data is inconsistent with data corresponding to a current bit of the data to be written and when the data corresponding to the current bit of the original data is 1, so that the memory cell corresponding to the current bit overwrites the data stored by the memory cell from 1 to 0, where the second control signal includes that the substrate of the memory cell is grounded, the source is grounded, the drain is grounded, and the gate is connected to a VPP.

Specifically, if the data corresponding to the current bit of the original data is inconsistent with the data corresponding to the current bit of the data to be written, a second control signal is generated when the data corresponding to the current bit of the original data is 1, where the second control signal includes that the substrate of the memory cell is grounded, the source is grounded, the drain is grounded, and the gate is connected to the VPP. Correspondingly, the memory cell 102 corresponding to the current bit receives the second control signal, and implements, according to a voltage connection condition of the substrate, the source, the drain, and the gate of the memory cell in the second control signal, that the substrate is grounded, the source is grounded, the drain is grounded, and the gate is connected to the voltage programming power VPP in the floating-gate MOS transistor, as shown in FIG. 5, where FIG. 5 is a schematic diagram of a floating-gate MOS transistor where 1 is overwritten into 0 provided by Embodiment 3 of the present invention. After the floating-gate MOS transistor is connected in this manner, charging a floating gate is performing programming on the current bit, thereby implementing a process of overwriting data that is stored by the memory cell and corresponds to the current bit from 1 to 0. That is, a process of bitwise programming is implemented.

In this embodiment, when original data in a memory cell of a Flash needs to be updated, a control circuit of the Flash reads the original data of a region to be updated; determines, on a bitwise basis, whether the original data is consistent with data to be written; and if inconsistent, generates a corresponding control signal, so that the memory cell corresponding to the current bit of the Flash overwrites the data corresponding to the current bit of the original data according to the corresponding control signal, thereby implementing bitwise erasing and bitwise programming on the data and implementing data updating. In other words, in a process of data updating, a corresponding overwrite operation is directly performed only on a bit to be updated, and it is unnecessary to search for a new block to write all data to be written or to perform an erase operation on a block to store data, which correspondingly reduces the times of additional read operations and write operations, thereby improving the operating efficiency and extending a service life of a Flash.

Embodiment 4

Referring to FIG. 6, FIG. 6 is a flowchart of a method embodiment for processing data according to Embodiment 4 of the present invention. The method for processing data is applicable to the Flash in Embodiment 1.

The method for processing data includes the following steps:

S401: When data stored by any one of memory cells is 0, generate a control signal, where the control signal includes that a substrate of the memory cell is grounded, a source is connected to a negative voltage programming power VPP, a drain is connected to the negative VPP, and a gate is connected to the negative VPP.

S402: Overwrite the data stored by the memory cell from 0 to 1 according to the control signal.

Specifically, when the data stored by any one of the memory cells is 0, the control signal is generated, where the control signal includes that the substrate of the memory cell is grounded, the source is connected to the negative VPP, the drain is connected to the negative VPP, and the gate is connected to the negative VPP. According to a voltage connection condition of the substrate, the source, the drain, and the gate of the memory cell in the control signal, the substrate is grounded, the source is connected to the negative VPP, the drain is connected to the negative VPP, and the gate is connected to the negative VPP in the floating-gate MOS transistor. After the floating-gate MOS transistor is connected in this manner, channel field strength distribution formed thereby enables an electric charge on a floating-gate to be moved to a channel, hence the electric charge on the floating gate is completely removed, thereby implementing a process of overwriting data corresponding to a current bit from 0 to 1. That is, a process of bitwise erasing is implemented.

In this embodiment, when data stored by any one of memory cells is 0, a control signal is generated, and the data stored by the memory cell is overwritten from 0 to 1 according to the control signal, thereby implementing bitwise erasing on the data and implementing data updating. In other words, in a process of data updating, a corresponding overwrite operation is directly performed only on a bit to be updated, and it is unnecessary to search for a new block to write all data to be written or to perform an erase operation on a block to perform data storage, which correspondingly reduces the times of additional read operations and write operations, thereby improving the operating efficiency and extending a service life of a flash memory.

Embodiment 5

Figure 7:
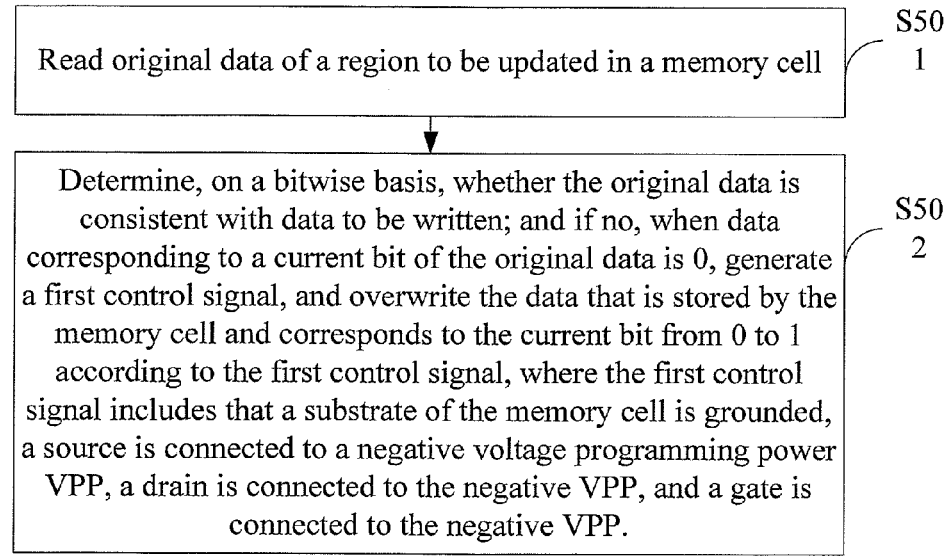
FIG. 7 is a flowchart of a method embodiment for processing data according to Embodiment 5 of the present invention.

Referring to FIG. 7, FIG. 7 is a flowchart of a method embodiment for processing data according to Embodiment 5 of the present invention. The method for processing data is applicable to the Flash in Embodiment 2 or 3.

The method for processing data includes the following steps:

S501: Read original data of a region to be updated in a memory cell.

S502: Determine, on a bitwise basis, whether the original data is consistent with data to be written; and if inconsistent, when data corresponding to a current bit of the original data is 0, generate a first control signal, and overwrite the data that is stored by the memory cell and corresponds to the current bit from 0 to 1 according to the first control signal, where the first control signal includes that a substrate of the memory cell is grounded, a source is connected to a negative voltage programming power VPP, a drain is connected to the negative VPP, and a gate is connected to the negative VPP.

In this embodiment, when original data of a region to be updated in a memory cell of a flash memory needs to be updated, the original data of the region to be updated is read; it is determined, on a bitwise basis, whether the original data is consistent with data to be written; and if inconsistent, when data corresponding to a current bit of the original data is 0, a first control signal is generated, so that the memory cell corresponding to the current bit overwrites data stored by the memory cell from 0 to 1, thereby implementing bitwise erasing on the data and implementing data updating. In other words, in a process of data updating, a corresponding overwrite operation is directly performed only on a bit to be updated, and it is unnecessary to search for a new block to write all data to be written or to perform an erase operation on a block to perform data storage, which correspondingly reduces the times of additional read operations and write operations, thereby improving the operating efficiency and extending a service life of a flash memory.

Embodiment 6

Figure 8:
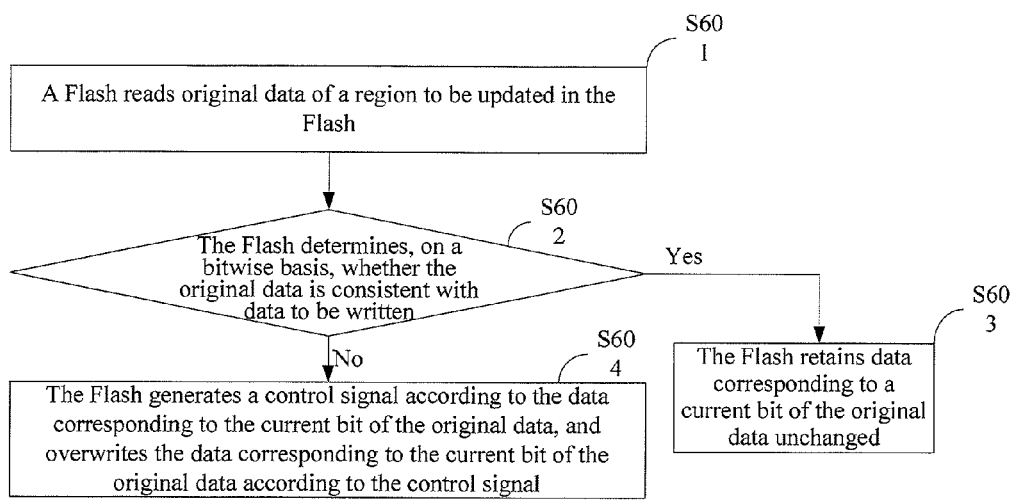
FIG. 8 is a flowchart of a method embodiment for processing data according to Embodiment 6 of the present invention.

Referring to FIG. 8, FIG. 8 is a flowchart of a method embodiment for processing data according to Embodiment 6 of the present invention. The method for processing data is applicable to the Flash in Embodiment 2 or 3.

The method for processing data includes the following steps:

S601: A Flash reads original data of a region to be updated in the Flash.

In this embodiment, the Flash includes several blocks, each block includes several pages, and each page includes several bytes. A width of a byte may be changed according to specific requirements, and generally is 8 bits, 16 bits, 32 bits, or the like.

The Flash may specifically address each byte when performing addressing. When data of an addressable byte in the Flash needs to be updated, a control circuit 101 of the Flash may read the original data of the region to be updated, where the original data may be stored in a binary form. For example, the original data is 10101001. The control circuit 101 may read the original data on a bitwise (bit) basis.

S602: The Flash determines, on a bitwise basis, whether the original data is consistent with data to be written; and if yes, performs S603; if inconsistent, performs S604.

After the original data is read, it is determined, on a bitwise basis, whether the original data is consistent with the data to be written. For example, the data to be written is 00111001, it is determined, on a bitwise basis, whether the original data 10101001 is consistent with the data 00111001 to be written, and then corresponding processing is performed according to a determining result.

S603: The Flash retains data corresponding to a current bit of the original data unchanged.

If the data corresponding to the current bit of the original data is consistent with data corresponding to a current bit of the data to be written, such as bits 0, 1, 2, 3, 5, and 6, no operation is performed on the data corresponding to the current bit of the original data.

S604: The Flash generates a control signal according to the data corresponding to the current bit of the original data, and overwrites the data corresponding to the current bit of the original data according to the control signal.

If the data corresponding to the current bit of the original data is inconsistent with the data corresponding to the current bit of the data to be written, such as bits 4 and 7, the control signal is generated according to the data corresponding to the current bit of the original data, and the control signal is sent to a memory cell 102 corresponding to the current bit, where the control signal includes a voltage connection condition of a substrate, a source, a drain, and a gate of the memory cell corresponding to the current bit.

The generating the control signal according to the data corresponding to the current bit of the original data includes:

when the data corresponding to the current bit of the original data is 0, generating a first control signal, where the first control signal includes that the substrate of the memory cell is grounded, the source is connected to a negative VPP, the drain is connected to the negative VPP, and the gate is connected to the negative VPP.

Correspondingly, the overwriting the data corresponding to the current bit of the original data according to the control signal includes:

overwriting the data corresponding to the current bit of the original data from 0 to 1 according to the first control signal.

Specifically, after the first control signal is generated, according to the voltage connection condition of the substrate, the source, the drain, and the gate of the memory cell in the first control signal, the substrate is grounded, the source is connected to the negative VPP, the drain is connected to the negative VPP, and the gate is connected to the negative VPP in the floating-gate MOS transistor. After the floating-gate MOS transistor is connected in this manner, channel field strength distribution formed thereby enables an electric charge on a floating-gate to be moved to a channel, hence the electric charge on the floating gate is completely removed, thereby implementing a process of overwriting the data corresponding to the current bit from 0 to 1. That is, a process of bitwise erasing is implemented.

Alternatively, the generating the control signal according to the data corresponding to the current bit of the original data includes:

when the data corresponding to the current bit of the original data is 1, generating a second control signal, where the second control signal includes that the substrate of the memory cell is grounded, the source is grounded, the drain is grounded, and the gate is connected to a voltage programming power VPP.

Correspondingly, the overwriting the data corresponding to the current bit of the original data according to the control signal includes:

overwriting the data corresponding to the current bit of the original data from 1 to 0 according to the second control signal.

Specifically, after the second control signal is generated, according to the voltage connection condition of the substrate, the source, the drain, and the gate of the memory cell in the second control signal, the substrate is grounded, the source is grounded, the drain is grounded, and the gate is connected to the VPP in the floating-gate MOS transistor. After the floating-gate MOS transistor is connected in this manner, charging a floating gate is performing programming on the current bit, thereby implementing a process of overwriting the data corresponding to the current bit from 1 to 0. That is, a process of bitwise programming is implemented.

Figure 1:
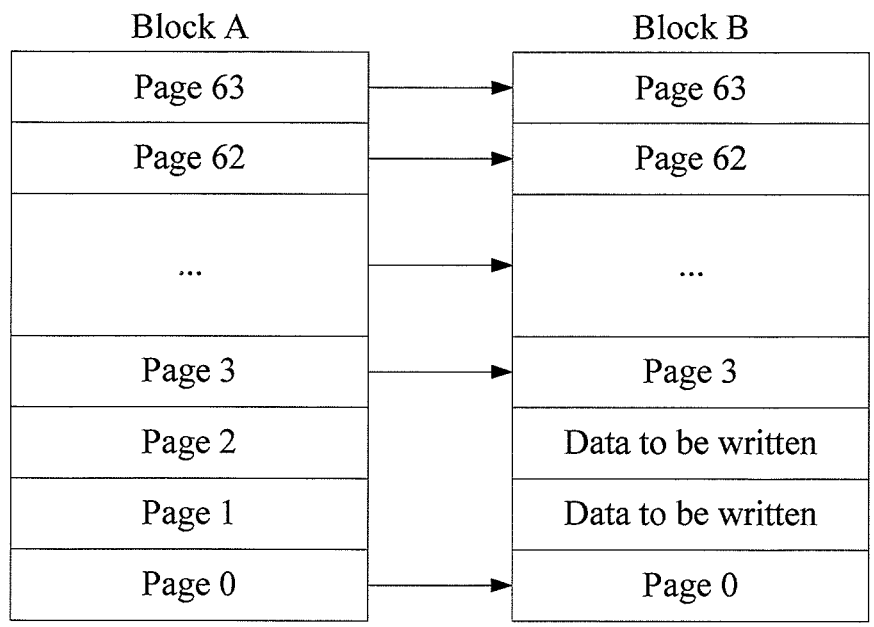
FIG. 1 is a schematic diagram illustrating data updating according to the prior art.

The following uses a specific example to describe in detail the method according to this embodiment. For example, in a block A shown in FIG. 1, data on a page 1 and a page 2 needs to be updated into data to be written. In other words, the page 1 and the page 2 of the block A are a region to be updated. A Flash may directly address each byte on the page 1 and the page 2 of the block A when performing addressing; reads original data on the page 1 and the page 2 of the block A according to bits in the byte; separately determines, on a bitwise basis, whether the original data on the page 1 and the page 2 is consistent with the data to be written; if consistent, retains data corresponding to a current bit of the original data unchanged; and if inconsistent, generates a control signal according to the data corresponding to the current bit of the original data, and overwrites the data corresponding to the current bit of the original data according to the control signal. Specifically, the data corresponding to the current bit of the original data may, according to the control signal, be overwritten from 1 to 0 or be overwritten from 0 to 1, thereby implementing data updating on the page 1 and the page 2 of the block A. Unlike the prior art, in the method according to this embodiment, storage may be performed without completely erasing a block, and an overwrite operation may be performed, on a bitwise basis, directly on a block to be updated to implement data storage. Therefore, in this embodiment, it is unnecessary to search for a new block B, hence unnecessary to read and write data on remaining 62 pages, which does not need to be updated, of the block A into corresponding positions of the block B, thereby reducing read operations and write operations, shortening time for programming data and time for reading data, and improving the operating efficiency.

In addition, in the method according to this embodiment, when data on two pages is updated, only data on the two pages needs to be read and compared with data to be written, and then overwriting from 1 to 0, overwriting from 0 to 1, or no operation is performed on a bitwise basis according to a change in the data. Considering random distribution of the original data and random distribution of data to be newly written, probabilities of overwriting 0 into 1, overwriting 1 into 0, retaining 0 unchanged, and retaining 1 unchanged are the same, hence a probability of a data change is 50%, a programming life of the Flash may increase by one time, and a service life of the Flash may increase by at least two times. Moreover, the method according to this embodiment reduces one erase operation, which also increases the service life of the Flash. In the prior art, 64 pages need to be written; in this embodiment, only two pages need to be written. In other words, the write operation in the prior art is amplified by 32 times and this embodiment avoids the write amplification by 32 times, thereby extending the service life of the flash memory. This is very helpful for improving reliability of a solid-state drive that includes a Flash.

In this embodiment, when original data in a memory cell of a Flash needs to be updated, the original data of a region to be updated is read; it is determined, on a bitwise basis, whether the original data is consistent with data to be written; and if yes, no processing is performed on data corresponding to a current bit of the original data; and if inconsistent, a control signal is generated and the data corresponding to the current bit of the original data is overwritten according to the control signal, thereby implementing bitwise erasing and bitwise programming on the data and implementing data updating. In other words, in a process of data updating, a corresponding overwrite operation is directly performed only on a bit to be updated, and it is unnecessary to search for a new block to write all data to be written or to perform an erase operation on a block to perform data storage, which correspondingly reduces the times of additional read operations and write operations, and reduces time for programming data and time for reading data, thereby improving the operating efficiency and extending a service life of a Flash.

Embodiment 7

Figure 9:
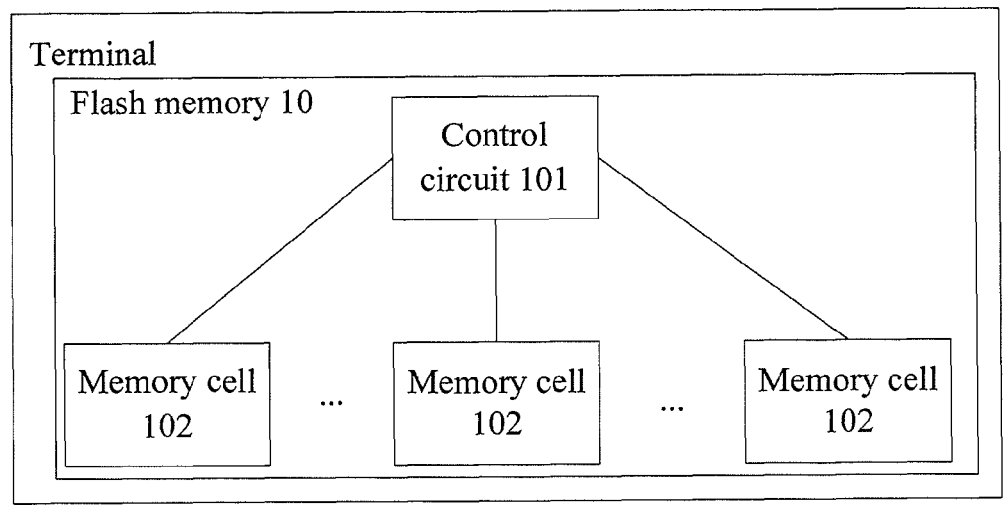
FIG. 9 is a schematic structural diagram of a terminal embodiment according to Embodiment 7 of the present invention.

Referring to FIG. 9, FIG. 9 is a schematic structural diagram of a terminal embodiment according to Embodiment 7 of the present invention. The terminal includes a flash memory 10, where the flash memory 10 includes a control circuit 101 and a plurality of memory cells 102.

A function of the control circuit 101 is similar to a function of the control circuit 101 in Embodiment 1, Embodiment 2, or Embodiment 3, which is not described repeatedly herein. For details, refer to the related description of Embodiment 1, Embodiment 2, or Embodiment 3. A function of the memory cell 102 is similar to a function of the memory cell 102 in Embodiment 1, Embodiment 2, or Embodiment 3, which is not described repeatedly herein. For details, refer to the related description of Embodiment 1, Embodiment 2, or Embodiment 3.

In this embodiment, when original data in a Flash of a terminal needs to be updated, original data of a region to be updated may be read; it is determined, on a bitwise basis, whether the original data is consistent with data to be written; and if yes, no processing is performed on data corresponding to a current bit of the original data; if inconsistent, a control signal is generated and the data corresponding to the current bit of the original data is overwritten according to the control signal, thereby implementing bitwise erasing and bitwise programming on the data, and eventually implementing data updating. In other words, in a process of data updating, a corresponding overwrite operation is directly performed only on a bit to be updated, and it is unnecessary to search for a new block to write all data to be written or to perform an erase operation on a block to perform data storage, which correspondingly reduces the times of additional read operations and write operations, and reduces time for programming data and time for reading data, thereby improving the operating efficiency and extending a service life of a Flash.

It should be noted that each embodiment in the specification is described in a progressive manner. Each embodiment illustrates in emphasis what is different from the other embodiments. The same or similar parts in the embodiments are references to each other. For an apparatus embodiment, since it is basically similar to a method embodiment, the apparatus embodiment is described simply, and the relevant part may be obtained with reference to the part of the description of the method embodiment.

It should be noted that in the text, a relationship term such as first and second is merely used to distinguish one entity or operation from another entity or operation, which does not necessarily require or imply any actual relationship or sequence between these entities or operations. Moreover, the terms "includes", "includes", or any other variation thereof are intended to cover a non-exclusive inclusion, so that a process, a method, an article, or a device that includes a series of elements is not necessarily limited only to those elements, but may include other elements not expressly listed or inherent to such process, method, article, or device. An element proceeded by "at least one . . . " does not, without more constraints, preclude the existence of additional identical elements in the process, method, article, or device that includes the element.

A person of ordinary skill in the art may understand that all or a part of the steps of the foregoing embodiments may be implemented by hardware or a program instructing relevant hardware. The program may be stored in a computer readable storage medium. The foregoing storage medium may be a read-only memory, a magnetic disk, or an optical disc.

The foregoing descriptions are merely exemplary embodiments of the present invention, but are not intended to limit the present invention. Any modifications, equivalent replacements, or improvements made within the spirit and principle of the present invention shall fall within the protection scope of the present invention.

What is claimed is:

1. A flash memory, comprising a control circuit and a plurality of memory cells, wherein:
   each of the plurality of memory cells is a floating-gate Metal-Oxide-Semiconductor (MOS) transistor comprising a source, a gate, a drain, and a substrate;
   the control circuit is separately connected to the source, the gate, the drain, and the substrate of each memory cell and configured to output a control signal to the source, the gate, the drain, and the substrate of each memory cell, so as to implement a bitwise overwrite operation on at least one of the memory cells; and
   the control circuit is further configured to generate the control signal when data stored by any one of the plurality of memory cells is 0, so that the data stored by the one memory cell is overwritten from 0 to 1 according to the control signal, wherein the control signal is configured to control the substrate of the one memory cell to be grounded, the source to be connected to a negative Voltage of Programming Power (VPP), the drain to be connected to the negative VPP, and the gate to be connected to the negative VPP.

2. A flash memory, comprising a control circuit and a plurality of memory cells, wherein:
   each of the plurality of memory cells is a floating-gate Metal-Oxide-Semiconductor (MOS) transistor comprising a source, a gate, a drain, and a substrate;
   the control circuit is separately connected to the source, the gate, the drain, and the substrate of each memory cell and configured to output a control signal to the source, the gate, the drain, and the substrate of each memory cell, so as to implement a bitwise overwrite operation on at least one memory cell; and
   the control circuit is further configured to read original data of a region to be updated in any one memory cell, determine, on a bitwise basis, whether the original data is consistent with data to be written, and if inconsistent, generate a first control signal when data corresponding to a current bit of the original data is 0, so that the one memory cell corresponding to the current bit overwrites data stored by the one memory cell from 0 to 1, wherein the first control signal is configured to control the substrate of the one memory cell to be grounded, the source to be connected to a negative Voltage of Programming Power (VPP), the drain to be connected to the negative VPP, and the gate to be connected to the negative VPP.

3. The flash memory according to claim 2, wherein the control circuit is further configured to generate a second control signal if the data corresponding to the current bit of the original data is inconsistent with data corresponding to a current bit of the data to be written and when the data corresponding to the current bit of the original data is 1, so that the one memory cell corresponding to the current bit overwrites the data stored by the one memory cell from 1 to 0, wherein the second control signal is configured to control the substrate of the one memory cell to be grounded, the source to be grounded, the drain to be grounded, and the gate to be connected to a VPP.

4. The flash memory of claim 2, wherein the original data and the data to be written are in byte form, the control circuit configured to determine individual bits that are inconsistent between the original data and the data to be written.

5. The flash memory of claim 4, wherein the control circuit is configured to retain individual bits that are consistent between the original data and the data to be written without performing any operation on the corresponding memory cells.

6. A method for processing data in a flash memory, the method comprising:
   separately connecting a control circuit to a source, a gate, a drain, and a substrate of each of a plurality of memory cells, each of the plurality of memory cells is a floating-gate Metal-Oxide-Semiconductor (MOS) transistor;
   generating by the control circuit a control signal when data stored by any one of the plurality of memory cells is 0, so that the data stored by the one memory cell is overwritten from 0 to 1 according to the control signal to implement a bitwise overwrite operation on the one memory cell, wherein the control signal is configured to control the substrate of the one memory cell to be grounded, the source to be connected to a negative Voltage of Programming Power (VPP), the drain to be connected to the negative VPP, and the gate to be connected to the negative VPP.

7. A method for processing data in a flash memory, the method comprising:
   separately connecting a control circuit to a source, a gate, a drain, and a substrate of each of a plurality of memory cells, each of the plurality of memory cells is a floating-gate Metal-Oxide-Semiconductor (MOS) transistor;
   reading by the control circuit original data of a region to be updated in any one memory cell;
   determining by the control circuit, on a bitwise basis, whether the original data is consistent with data to be written; and
   if the original data is inconsistent with the data to be written, generating a first control signal when data corresponding to a current bit of the original data is 0, so that the one memory cell corresponding to the current bit overwrites data stored by the one memory cell from 0 to 1, wherein the first control signal is configured to control the substrate of the one memory cell to be grounded, the source to be connected to a negative Voltage of Programming Power (VPP), the drain to be connected to the negative VPP, and the gate to be connected to the negative VPP.

8. The method of claim 7, further comprising:
   if the original data is inconsistent with the data to be written, generating by the control circuit a second control signal when the data corresponding to the current bit of the original data is 1, so that the one memory cell corresponding to the current bit overwrites the data stored by the one memory cell from 1 to 0, wherein the second control signal is configured to control the substrate of the one memory cell to be grounded, the source to be grounded, the drain to be grounded, and the gate to be connected to a VPP.

9. The method of claim 7, wherein the original data and the data to be written are in byte form, the method further comprising determining individual bits that are inconsistent between the original data and the data to be written.

10. The method of claim 9, further comprising:
    retaining individual bits that are consistent between the original data and the data to be written without performing any operation on the corresponding memory cells.

* * * * *